United States Patent
Efland et al.

(10) Patent No.: US 6,784,493 B2
(45) Date of Patent: Aug. 31, 2004

(54) LINE SELF PROTECTING MULTIPLE OUTPUT POWER IC ARCHITECTURE

(75) Inventors: Taylor R. Efland, Richardson, TX (US); David A. Grant, Dallas, TX (US); Ramanathan Ramani, Richardson, TX (US); Dale Skelton, Plano, TX (US); David D. Briggs, Richardson, TX (US); Chin-Yu Tsai, HsinChu Hsien (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/166,956

(22) Filed: Jun. 11, 2002

(65) Prior Publication Data

US 2003/0228729 A1 Dec. 11, 2003

(51) Int. Cl.⁷ ............................................. H01L 29/00
(52) U.S. Cl. ...................... 257/347; 257/502; 257/549
(58) Field of Search .................. 257/335–343, 257/347, 350, 351, 500–503, 549

(56) References Cited

U.S. PATENT DOCUMENTS 5,939,755 A  *  8/1999  Takeuchi et al. ............ 257/347
6,160,304 A  * 12/2000  Ludikhuize ................. 257/549
6,225,673 B1 *  5/2001  Pendharkar et al. ........ 257/502

* cited by examiner

Primary Examiner—Dung A. Le
(74) Attorney, Agent, or Firm—Peter K. McLarty; W. James Brady, III; Frederick J. Telecky, Jr.

(57) ABSTRACT

A power integrated circuit architecture (10) having a high side transistor (100) interposed between a control circuit (152) and a low side transistor (100) to reduce the effects of the low side transistor on the operation of the control circuit. The low side transistor has a heavily p-doped region (56) designed to reduce minority carrier lifetime and improve minority carrier collection to reduce the minority carriers from disturbing the control circuit. The low side transistor has a guardring (16) tied to an analog ground, whereby the control circuit is tied to a digital ground, such that the collection of the minority carriers into the analog ground does not disturb the operation of the control circuit. The low side transistor is comprised of multiple transistor arrays (90) partitioned by at least one deep n-type region (16), which deep n-type region forms a guardring about the respective transistor array. The guardring isolates minority carriers in one transistor array from another transistor array, and facilitates the collection of the minority carriers therethrough.

20 Claims, 10 Drawing Sheets

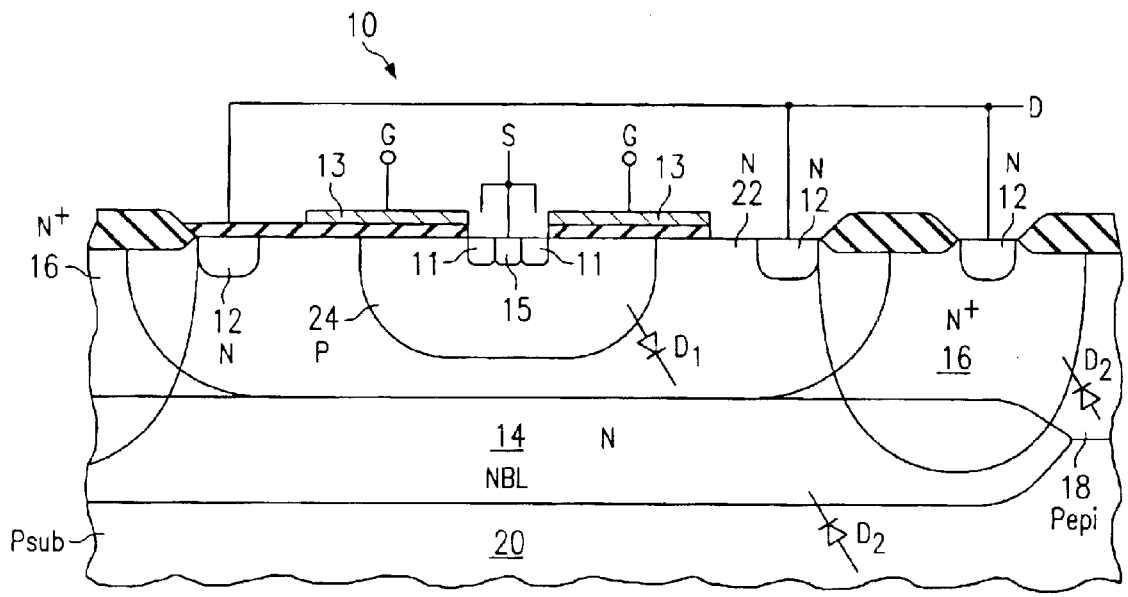
FIG. 1
(CONVENTIONAL)
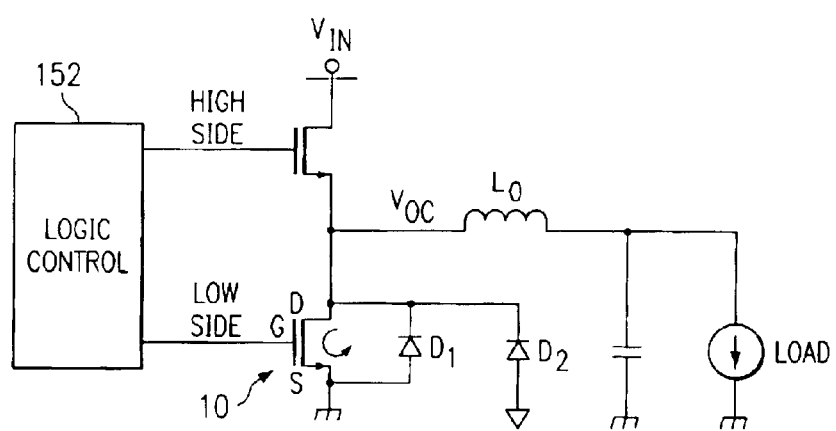
FIG. 2
(CONVENTIONAL)

US 6,784,493 B2

LINE SELF PROTECTING MULTIPLE OUTPUT POWER IC ARCHITECTURE

CLAIM OF PRIORITY OF RELATED APPLICATIONS

This application claims priority of co-pending application Ser. No. 09/550,746, filed Apr. 17, 2000 entitled "HIGH SIDE AND LOW SIDE METHOD OF GUARD RINGS FOR LOWEST PARASITIC PERFORMANCE IN AN H-BRIDGE CONFIGURATION" commonly assigned to the present applicant and the teachings of which are incorporated herein by reference.

FIELD OF THE INVENTION

This invention relates to semiconductor devices, and more particularly, to semiconductor transistors including an LDMOS (lateral double-diffused metal oxide semiconductor) device.

BACKGROUND OF THE INVENTION

Battery-operated electronic systems such as notebook personal computers, personal digital assistants, and wireless communication devices often use power MOS (metal oxide semiconductor) devices as low on-resistance electronic switches for distributing battery power. For battery-operated application, low on-resistance can be particularly important to ensure as little power consumption to the battery as possible. This ensures long battery life.

DMOS devices are "double diffused" MOS devices. A DMOS device is characterized by a source region and a back gate region, which are diffused at the same time. The back gate region is sometimes referred to as a Dwell (double diffused well) region. The channel is formed by the difference in the two diffusions, rather than by separate implantation. DMOS devices have the advantage of decreasing the length of the channels, thus providing low-power dissipation and high-speed capability.

DMOS devices may have either lateral or vertical configurations. A DMOS device having a lateral configuration (referred to herein as an LDMOS), has its source and drain at the surface of the semiconductor wafer. Thus, the current is lateral. Desired characteristics of an LDMOS are a high breakdown voltage, BV, and a low specific on-resistance.

A conventional LDMOS configuration is shown at 10 in FIG. 1, with a source region shown at 11, a drain region at 12, a gate region at 13, and a backgate region at 15. Since the drain region 12 is integral to the NBL 14, then it cannot be isolated in its own tank from the parasitic collection guardring consisting of NBL 14 and DEEP N+ well 16. Therefore, when in use as a low side device driving an inductive load, as shown schematically in FIG. 2, then when device 10 is switched off or to a condition when the drain 12 of the device 10 consequently becomes negative, the integral parasitic diode D2 from P-epi 18/substrate 20 to Deep N+ 16, and the parasitic diode D1 from the p-type backgate 24 to N-region 22 both conduct. As a consequence of this conduction, the P backgate 24, P-epi 18 and substrate 20 build up a large amount of minority charge, in this case, electrons. When switched back on, or changed to a blocking state, the electrons either have to be recombined or collected by the drift field set up with an N type region that is positively biased. In the case of FIG. 1, the electrons in the P region 24 will have to recombine and will thus create a long recovery time. In the regions 18 and 20 the electrons will get collected by some other N region.

This method of collection can create a very large problem of classical latch-up if collection efficiency is low. Additionally, the extra collection guardring 14 and 16 uses a lot of silicon area and it is desired to eliminate this area usage.

An optimized tank—isolated drain device that overcomes these problems is needed in an advanced CMOS process capable of very high current operating conditions and switching through required breakdown. The improved device should reduce the minority carrier lifetime to improve switching speed. The on resistance performance of this device needs to be extremely competitive to enable the highest current possible at very low drive voltage in the smallest form factor package.

SUMMARY OF THE INVENTION

The present invention achieves technical advantages as a power integrated circuit architecture whereby a high side transistor is interposed between a control circuit and a low side transistor to reduce the effects of the low side transistor on the operation of the control circuit. Preferably, the low side transistor is designed to have a reduced minority carrier lifetime and an improved minority carrier collection to reduce the minority carriers from disturbing the control circuit. The low side transistor has a collection ring tied to an analog ground, whereby the control circuit is tied to a digital ground, such that the collection of the minority carriers into the analog ground does not disturb the operation of the control circuit.

Advantageously, the low side transistor and high side transistor are separated from one another by a deep n-type region, and by a P-epi tank. The low side transistor is comprised of multiple transistor arrays partitioned by at least one deep n-type region, which deep n-type region forms a guardring about the respective transistor array. The guardring isolates minority carriers in one transistor array from another transistor array, and facilitates the collection of the minority carriers therethrough. The guardring of the low side transistor is preferably grounded, whereby the guardring of the high side transistor is preferably tied to a positive potential. Advantageously, the high side transistor being interposed between the control circuit and the low side transistor further collects any minority carriers that are not collected by the low side transistor.

BRIEF DESCRIPTION OF THE DRAWINGS

FIG. 1 is a cross-sectional elevational view of a LDMOS transistor;

FIG. 2 is an electrical schematic of the device of FIG. 1 illustrating that when $V_{oc}$ is negative diode D1 conducts, as does diode D2 such that the drain region is filled with minority carriers;

DETAILED DESCRIPTION OF THE PREFERRED EMBODIMENT

Figure 3:
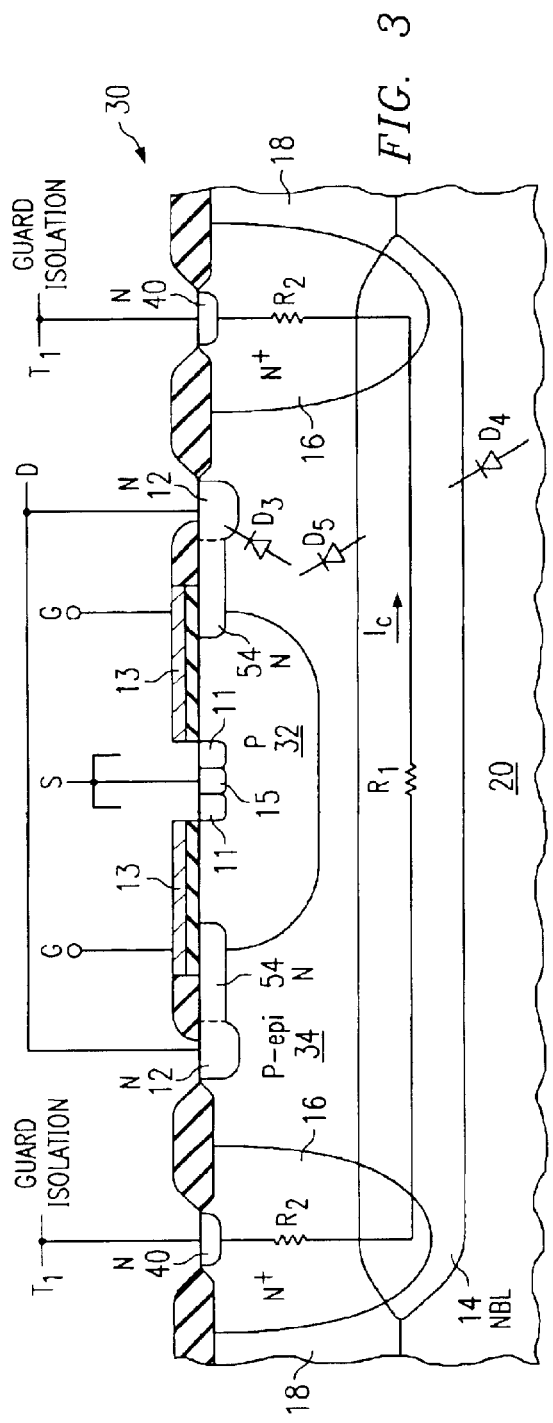
FIG. 3 is a cross-sectional elevational view of a first preferred embodiment of the present invention having a tank-isolated drain extended power device and including a double diffused p-type layer.
Figure 4:
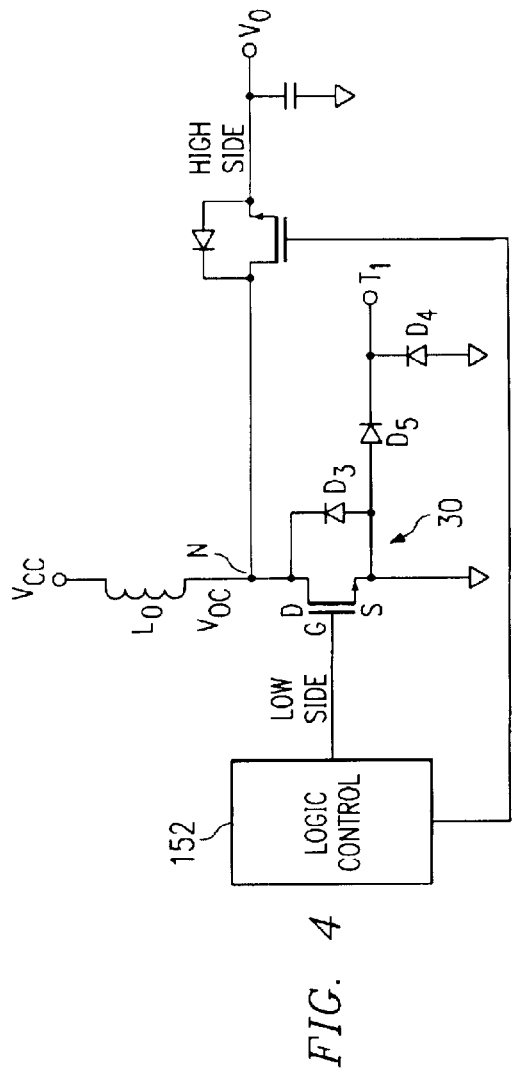
FIG. 4 is an electrical schematic of the device of FIG. 3 coupled to an inductive load.

Referring now to FIG. 3, there is shown a first preferred embodiment of the present invention at 30, with the device driving an inductive load shown schematically in FIG. 4. As a first embodiment of this invention, a double diffused p-type layer 32 is provided, as shown, although it is noted a first planar style or drain extended device is shown if layer 32 is omitted. The advantageous purpose of this highly P-doped layer 32 is to enhance conduction and raise the surface concentration thereof to achieve a respectable VT of about 1.0V. A P-epi tank region 34 is provided that by itself is very lightly doped and results in depletion mode operation. In the absence of double diffused p-type layer 32, generally a Vt adjust implant is used. In this case, parasitic diode D3 will conduct in the same fashion as previously mentioned for the same conditions and the isolated P-epi tank region 34 will fill with minority electrons. This low doped region will have very good lifetime and make it difficult to recombine, thus, a long recovery time will result during switching. The inclusion of double diffused region 32 in this first preferred embodiment decreases this lifetime by increasing majority carrier concentration and the probability of recombination, while doubly performing the enhanced features as mentioned above. A lightly n-doped RESURF region 54 may be included to enhance the breakdown voltage of the device.

Terminal T1, shown as an N region 40, may be connected to a positive voltage potential to act as a parasitic collector and guardring. Electrons, or minority carriers in this case, are collected via the drift field set up by the reverse bias of the parasitic diode D4. Since, in general, the substrate 20 is grounded, then diode D4 will be reverse biased also. The collection of the electrons is taken in the form of electric current and passes through resistance R1 and R2 as shown in NBL 14 and Deep N+ 16. With terminal T1 being tied high, then the resistive drop down this resistance creates a fall off of voltage along the resistance. If this drop falls below the potential of region 18 or 20, then diode D4 will forward bias and create minority generation in these regions, which is to be avoided as previously discussed. So, if terminal T1 is tied to a very high potential, then the chances of having enough current to create this problem are very low. However, by tying this terminal T1 to a high potential, then the power loss to the circuit is high since the V(T1)*Ic=P will be high. It is thus desired to have terminal T1 tied at a low potential, as shown. What is most desired is to control the minority build up so that a) recovery time is reduced and b) power loss due to collection is minimized.

Figure 5:
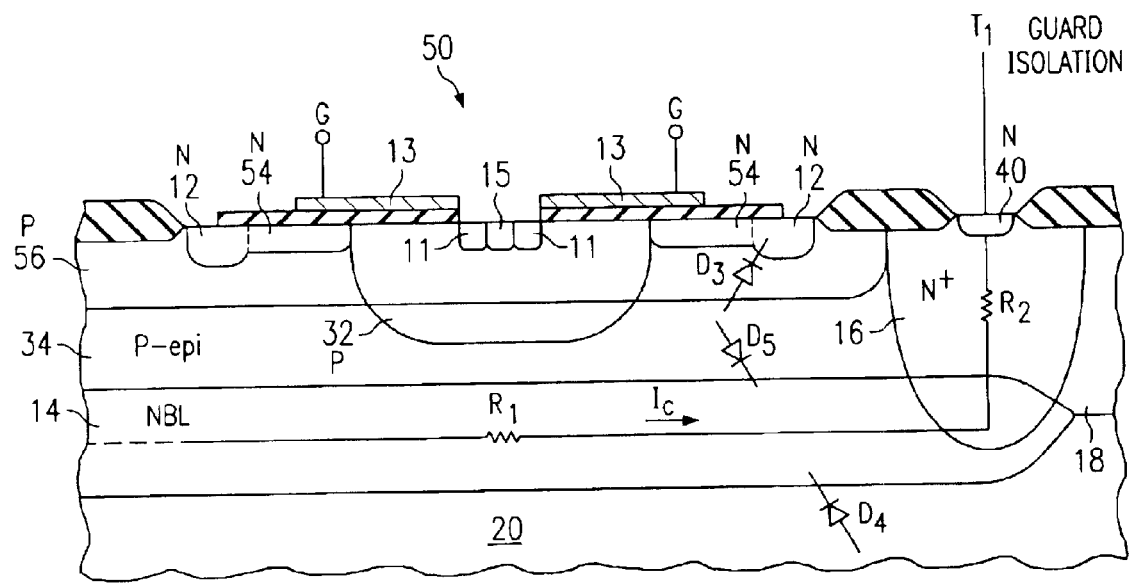
FIG. 5 is a cross-sectional elevational view of a second preferred embodiment of the present invention including an added P-type region blanket implanted in the isolated P-epi tank region.

Referring now to FIG. 5 there is shown a second preferred embodiment of the present invention at 50, comprising a transistor adapted to operate as a low side transistor and drive an inductive load, but which may also serve as the high side transistor. In this FIG. 5 the double diffused p-type layer region 32 (Dwell) with the fore mentioned meaning and enhancement is shown as necessary and intended. In addition to this first p-doped region 32, a new second heavily p-doped region 56 laterally extending to drain 12 is implanted in layer 34 using the existing process. This second laterally extending heavily doped region 56 enhances the depletion and breakdown of the extended drain 12, and advantageously aids in the reduction of minority lifetime, thus allowing a faster recombination and reduction in minority build up. This second region 56 also reduces the value of current Ic during switching. Moreover, the additional p-doped region 56 may be added as an implanted well region of p-type material, as shown, preferably being a blanket implantation into the isolated P-epi tank region 34. Preferably, the p-doping level of tank region 32 is greater than the p-doping level of added second region 56, and the doping level of region 56 is greater than the p-doping level of P-epi layer 34. For example, tank region 32 may have a p-doping of $6 \times 10^{13}/cm^2$, the second p-doped region 56 may have a doping of $8 \times 10^{12}/cm^2$, and the P-epi tank region 34 may be 7 ohm-cm.

Figure 6:
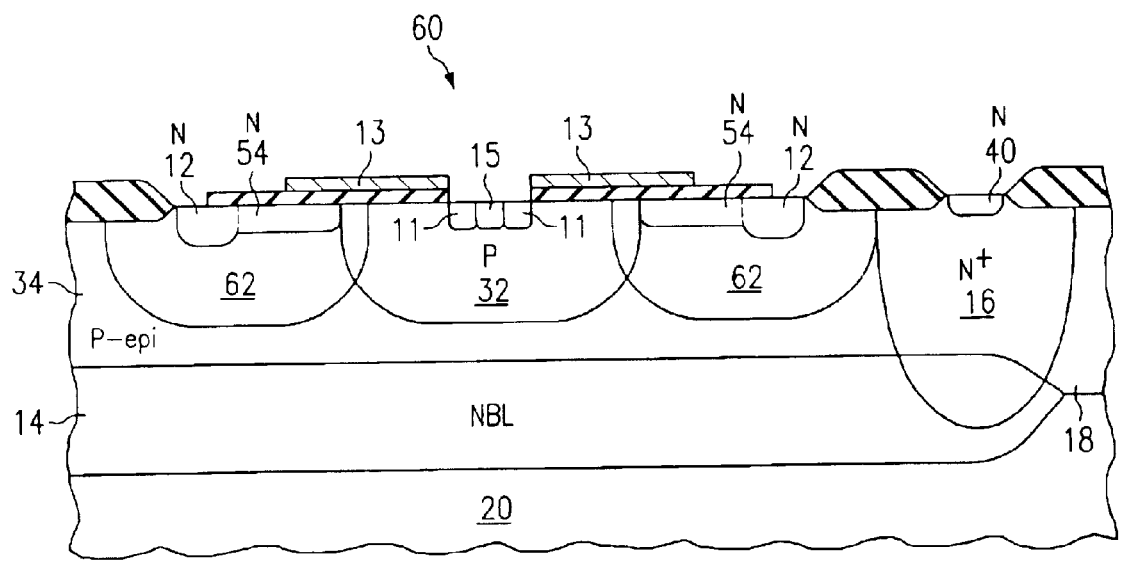
FIG. 6 is a cross-sectional elevational view of yet another embodiment of the present invention whereby additional P-type regions are provided and patterned to be out of the double diffused region and covering the other portions of the isolated P-epi tank.

FIG. 6 shows yet another embodiment at 60 that provides a newly introduced second p-type region 62 being patterned, rather than implanted region 56, so as not to interfere with region 32 enhancements if desired. In the Figures, region 32 is meant to be designated as a double diffused region either photo aligned or self aligned to the poly gate as known to those skilled in the art, whereby region 62 is a p-well that is not double diffused in the sense of being self aligned to the source forming a channel. Again, the first p-doped region 32 is more heavily doped than the second additional p-doped region 62, and second p-doped region 62 is more heavily doped than P-epi layer 34.

Figure 7:
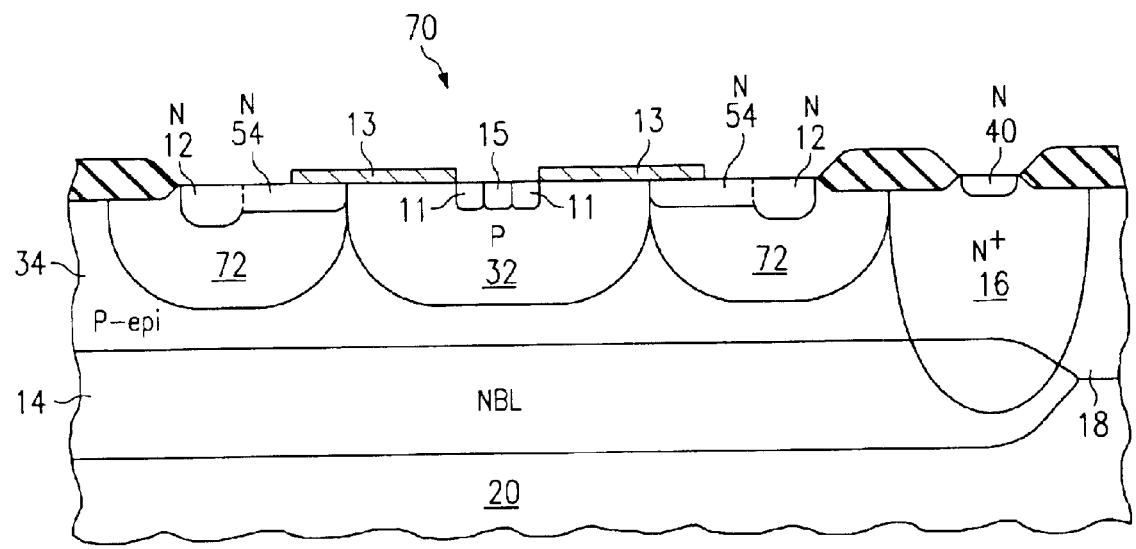
FIG. 7 is a cross-sectional elevational view of yet another embodiment of the present invention whereby the double diffused p-type region and the adjacent regions consist of the same region and provide an enhanced channel region profile for lateral diffusion.

FIG. 7 shows another preferred embodiment at 70 where by a second p-doped region 72 is provided with p-doped region 32 consisting of the same region. This embodiment adds the value of providing an enhanced channel region from lateral diffusion profile, and maximizes minority reduction by being formed in other locations also.

Figure 8:
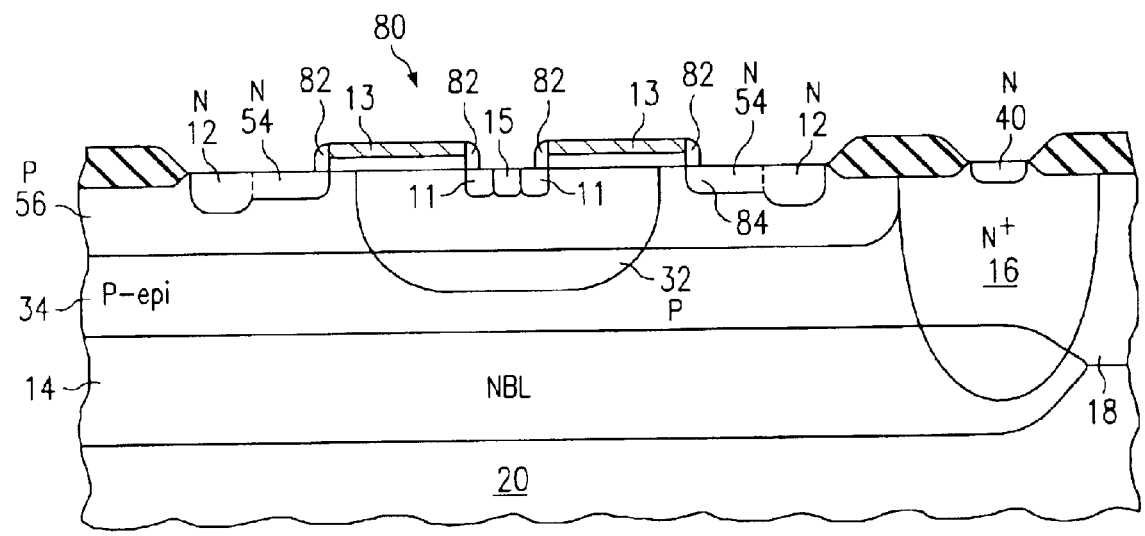
FIG. 8 illustrates a cross-sectional elevational view another embodiment whereby the double diffused p-type region and the laterally extending drain regions are depicted to be separately, or at the same time, to be aligned to the poly gate region via poly edge or side wall formation edge or photo alignment.

FIG. 8 shows another embodiment at 80 whereby for any of the embodiments herein mentioned, the first p-type region 32 and the second laterally extending p-type region 56 could separately, or at the same time as an option, occur in the embodiments being aligned to the poly gate region via poly edge or sidewall formation edge, or photo aligned, as shown at 82 and 84.

In still yet another embodiment, a mega electron volt (MEV) diffusion process could be utilized to form the double diffused p-type region 32 below a surface of the p-tank layer 34.

Figure 9:
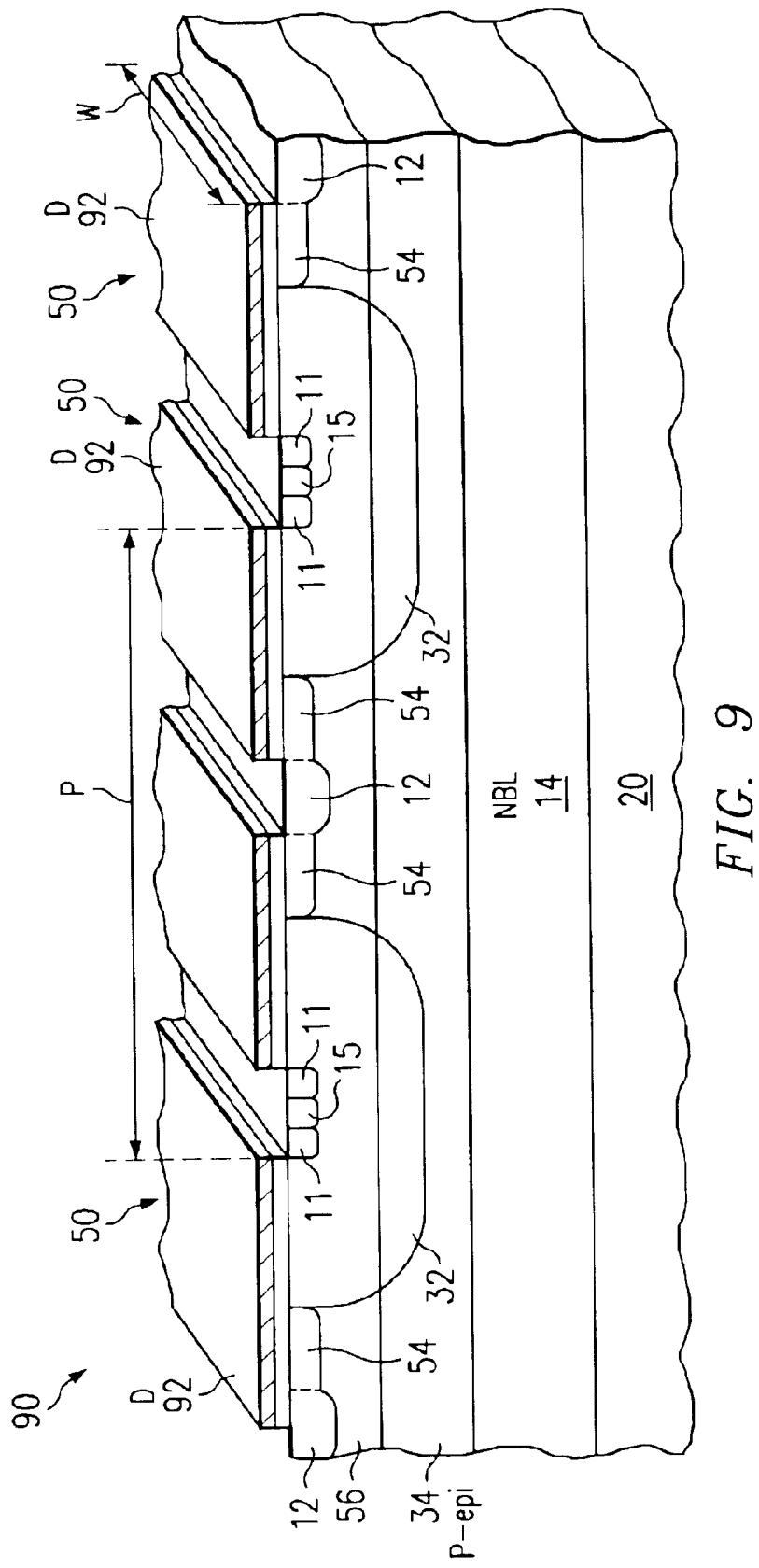
FIG. 9 is a cross sectional view of multiple transistors 50 formed in a common P-epi tank and sharing a common interconnected heavily doped p-region.

Referring now to FIG. 9, there is shown generally at 90 a cross section of a power FET semiconductor device having a plurality of transistors 50 formed in the P-epi tank 34 adjacent to one another and sharing the second heavily p-doped region 56 extending beneath each of the respective drain regions. As shown, the drain regions 12 including the lightly doped RESURF regions 54 extend above and proximate the common heavily doped p-type region 56 which serves to reduce the minority carrier lifetime thereat as previously discussed with regards to FIGS. 1–8. The plurality of transistors 50 defined in the P-epi tank 34 are seen to have elongated strips of metalization 92 formed over the respective drain regions 12. The width of the structure is depicted as W, and the pitch of the structure is depicted as P. As can be appreciated in FIG. 9, the architecture of the device 50, including the first p-type region Dwell 32 and the second p-type region 56, is suitable to provide the array 90 of transistors 50 having a good pitch P. As depicted in FIG. 9 the plurality of transistors 50 have the common interconnected p-type region 56, a common P-epi tank 34, and the common laterally extending NBL 14 below, as shown.

Figure 10:
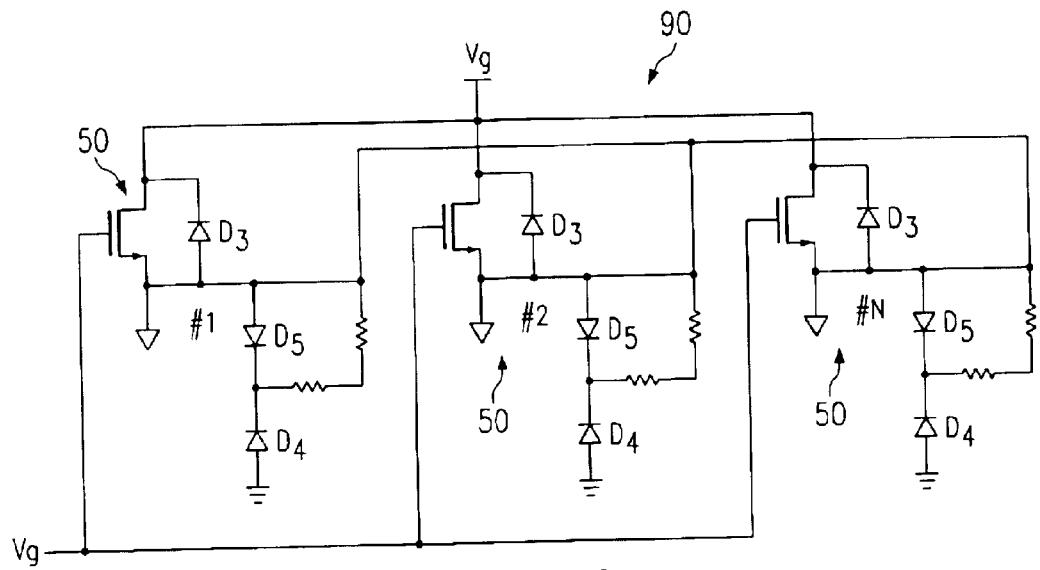
FIG. 10 is a schematic of the equivalent circuit of the transistors interconnected in parallel.

Referring now to FIG. 10, there is shown an electrical schematic equivalent of the transistor array 90 of FIG. 9 depicting the gates of the plurality of transistors 50 being commonly connected to one another and biased by voltage Vg, the sources of each transistor 50 being commonly connected to one another, and the drains of each transistor 50 being commonly connected to one another to comprise a series of parallel connected devices. The transistor array 90 shown in FIG. 10 collectively forms a large power FET transistor advantageously suited for the low side transistor of the circuit shown in FIG. 4. As previously discussed, each of the transistors 50 are designed to reduce the minority carrier lifetime such that the collective array 90 of transistors 50 forming the large power FET also has a reduced minority carrier lifetime, particularly when utilized as a low side large power FET such as shown in FIG. 4. Moreover, the power ground is seen to be isolated from the system or logic ground.

Figure 11:
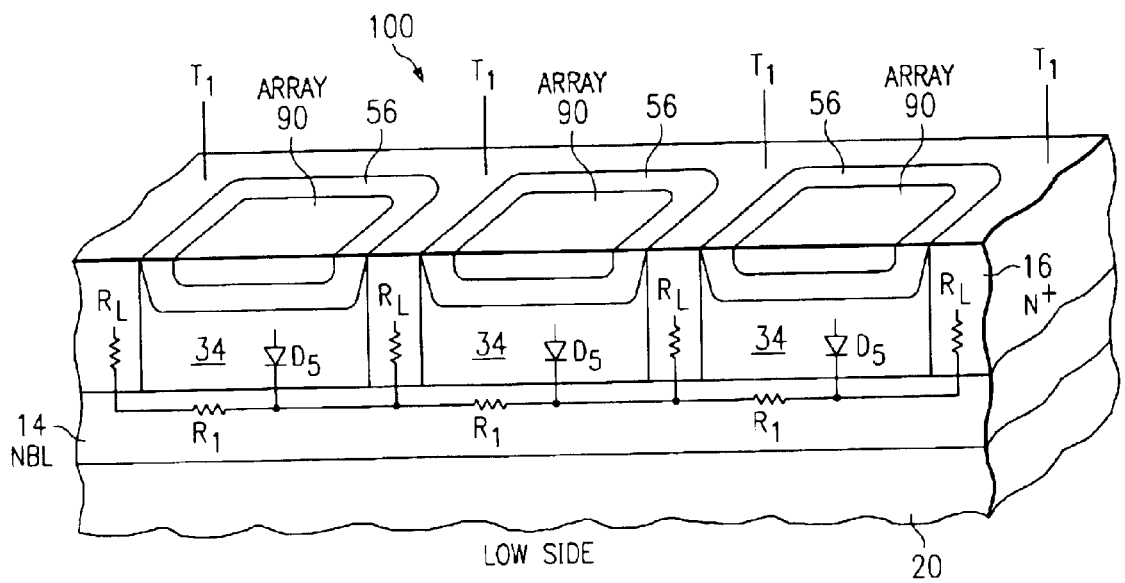
FIG. 11 is a sectional diagram illustrating a plurality of transistor arrays isolated from one another by a deep n-type region to distribute the resistance of the NBL region and the parasitic diodes.

Referring now to FIG. 11, there is generally shown at 100 a distributed power device having multiple sections of array 90 formed upon the P substrate 20. Each array 90 is separated from another by a deep n-type region 16 so as intentionally divide the resistance R1 in the NBL region 14 and the resistance $R_L$ formed in the vertically extending deep n-type region 16, seen to be in $N^+$ sinker region. Advantageously, these multiple arrays 90, which are each interconnected to each other such that all transistors 50 therein are connected in parallel to form a large power FET, are divided to increase the minority carrier collection into the deep n-type regions 16. The multiple arrays 90 also distribute the parasitic diode D5 which conducts the minority current of the respective array 90 into the respective NBL resistor R1 and the deep n-type region 16 collectively forming guardrings about the respective arrays 90.

Figure 12:
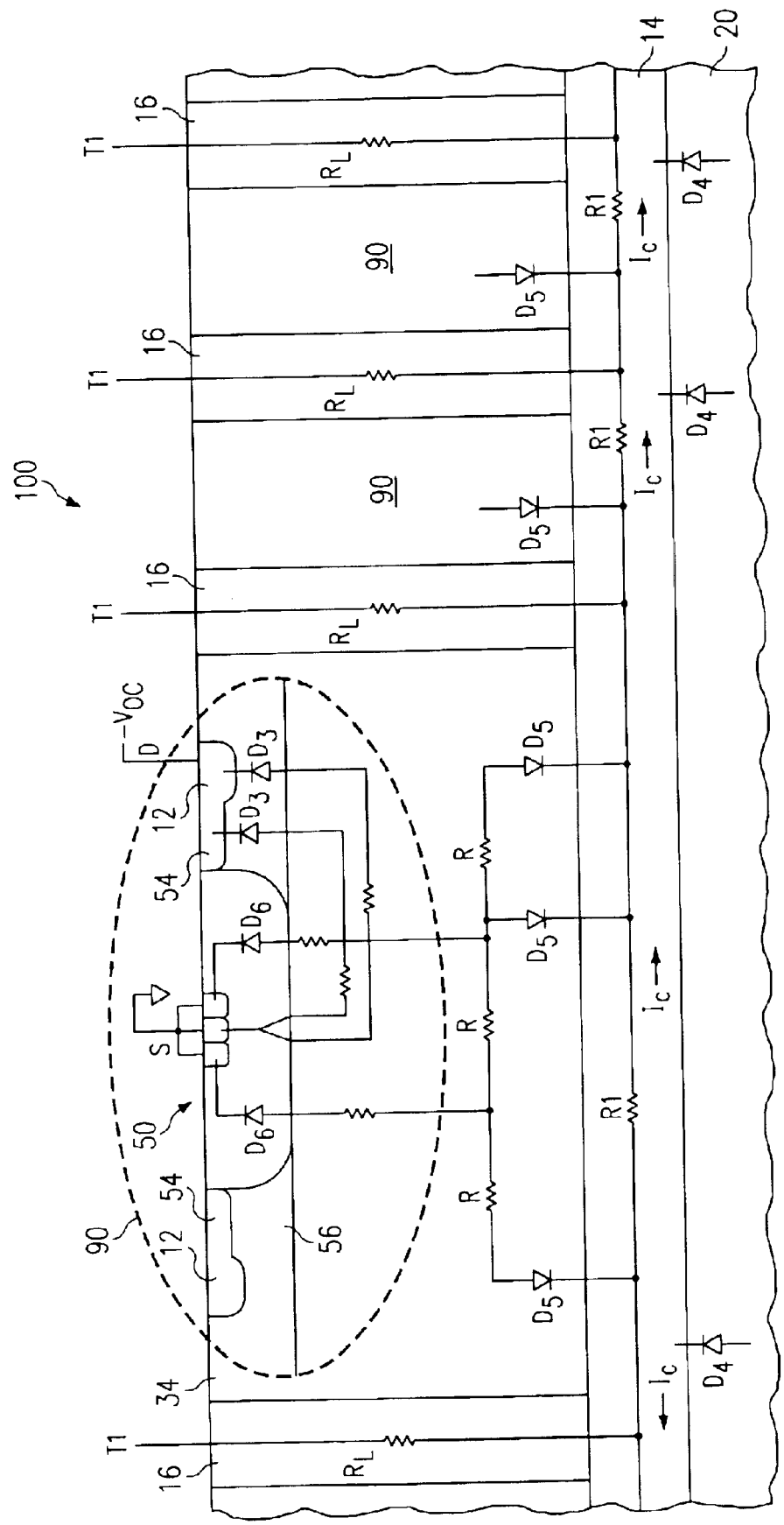
FIG. 12 is a cross sectional view of the device of FIG. 11 further depicting each transistor array having minority carriers collected into a respective portion of the NBL layer via a respective parasitic diode D5 for collection via an adjacent terminal T1.

Referring to FIG. 12, there is schematicly depicted one transistor array section 90 including a plurality of transistors 50 whereby each array 90 is seen to have a respective parasitic diode D5 transferring minority carriers from p-type region 56 to the respective portion of the NBL region 14 for ultimate collection via the deep n-type region 16 to terminal T1, which is preferably grounded when device 100 is utilized as a low side transistor. As will be discussed shortly, the terminal T1 may be tied to a positive potential when utilized as a large power FET utilized as a high side transistor.

As can be appreciated in FIG. 12, the parasitic diode D5 is distributed by the array sections 90 and conducts minority current into the respective resistors R1 formed in the NBL region 14 and resistor $R_L$ formed in the deep n-type region 16. Looking from terminal T1 back along the resistance nodes formed by resistors R1, the voltage will drop towards —Voc. The longer the expanse along the NBL region 14 from the terminal T1, the lower the drop. Or, the higher the current the lower the drop. If the potential along any node drops below the $V_{be}$ of parasitic diode D4 formed between the NBL region 14 and the substrate 20, then the diode D4 will conduct creating a unwanted effect, and which biasing of diodes D4 needs to be avoided. Therefore, the array regions 90 are designed based on the resistance of the NBL region 14 and the deep n-type regions 16 so that current conducting along the NBL region 14 to terminal T1 does not produce a sufficient voltage drop to allow the substrate diodes D4 to conduct.

Preferably, thousands of transistors 50 are interconnected in parallel to form the large power FETs forming the low side transistor and the high side transistor, as depicted schematicly in FIG. 4. Advantageously, the present invention partitions the transistors 50 into sections which are divided by the deep n-type regions 16 forming guardrings about the transistor array portions 90. This partitioning advantageously provides that a voltage drop created by the current Ic conducting through resistors R1 and $R_L$ does not provide a sufficient voltage drop to forward bias the substrate diode D4. The present invention achieves technical advantages by reducing the minority carrier lifetime through the addition of the highly p-doped region 56, and in addition, by partitioning the large power FET 100 into array portions 90 such that the collected minority current will not forward bias any of the parasitic diodes D4 to the substrate 20.

Figure 13:
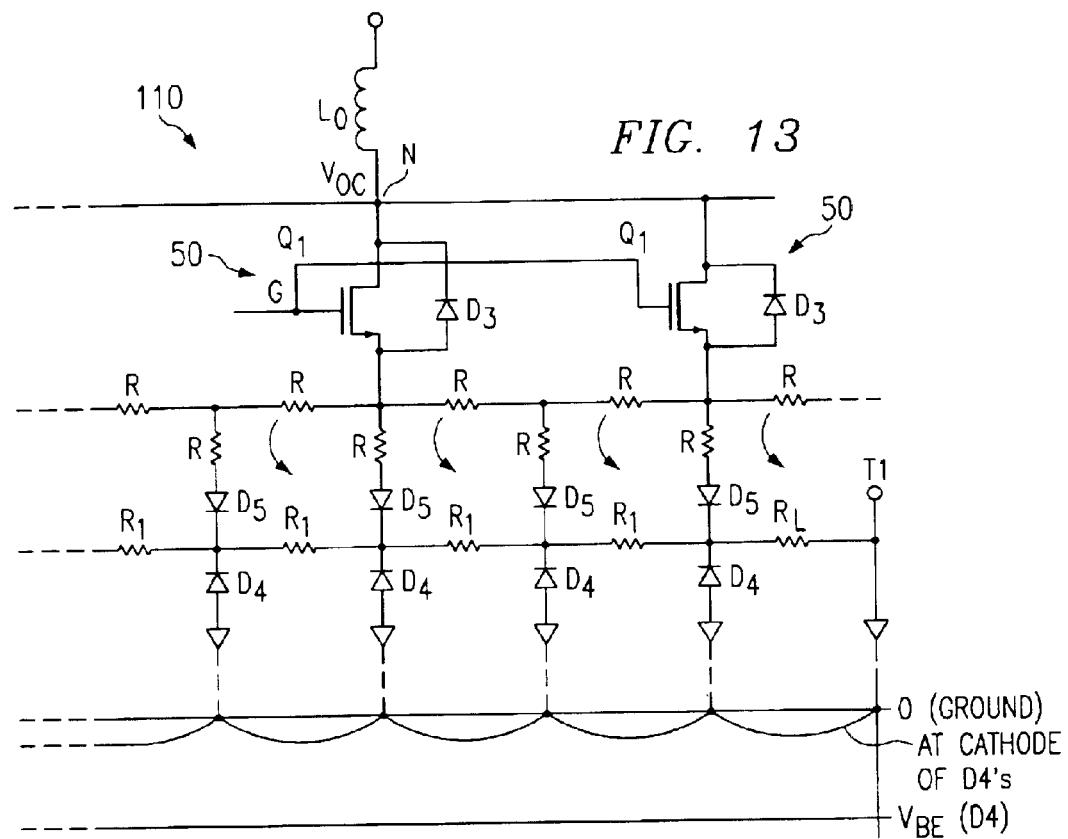
FIG. 13 is a schematic diagram illustrating an equivalent circuit of the arrayed power device including a plurality of transistors, and illustrating that the voltage along the NBL layer, at any node, does not drop below the biasing voltage of the parasitic substrate diode D4.

Referring to FIG. 13, there is depicted at 110 at schematic equivalent of the arrayed power device including a plurality of transistors 50 depicted as transistors Q1, each having the respective parasitic diode D3 which may be biased due to the voltage potential —Voc at node N. As previously discussed in regards to FIGS. 11 and 12, each of the arrayed portions 90 create a distributed parasitic diode D5, as shown in FIG. 13, which array portions 90 break up the resistance R of the P-epi layer 34, and the resistance R1 of the NBL layer 14, as shown. The parasitic diode D4 is further partitioned with this architecture as shown such that the minority carrier collection via the respective parasitic diodes D5 to the terminal T1 will not forward bias the substrate diodes D4. The associate graph along the bottom of the FIG. 13 shows that the potential along the NBL region 14 never drops below the $V_{be}$ of any of the parasitic diodes D4, thus preventing these diodes from ever conducting.

Figure 14:
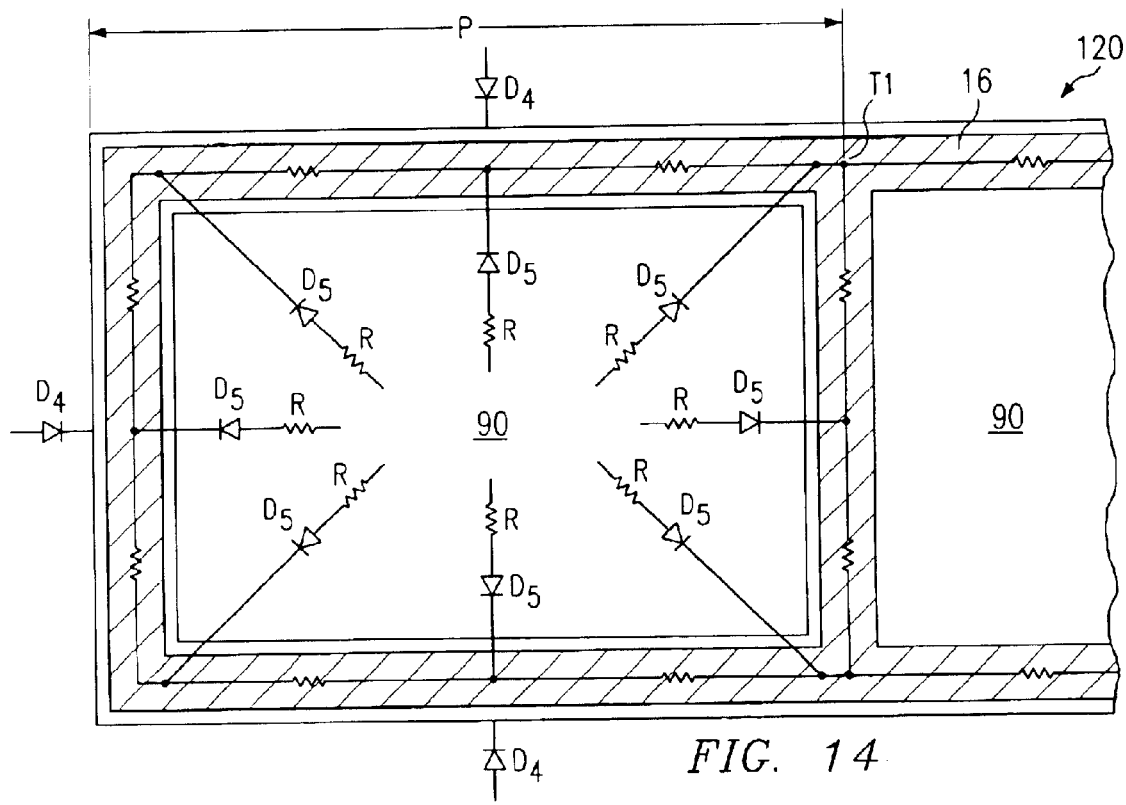
FIG. 14 is a top view of the transistor arrays arranged in an in-line arrangement, with each array being a three dimensional volume array surrounded by a four sided guardring.

Referring now to FIG. 14, there is depicted at 120 a top view of the in-line arrays 90 separated from one another by the deep end-type region 16 forming a four sided guardring about the respective transistor arrays 90 with the distributed diodes D4 and D5. As can be appreciated in FIG. 14, the array 90 is a three dimensional volume array, and the design of the present invention allows optimal layout to create the large multi-dimensional arrays needed to form the large power FETs utilized as high and low side transistor devices. For instance, these large power FETs are typically designed to conduct up to 6 and 8 amps, depending on the circuit application. FIG. 14 depicts a linear array, although the architecture is well suited to provide area arrays of arrays 90 which are all interconnected, such as using metalization (not shown) to form the large power FETs with each of the transistors in parallel to one another as previously described.

As can be appreciated in FIG. 14, the guardring may be tied using terminal $T_1$ to a potential, preferably ground when the power FET is utilized as a low side device, and preferably to a positive voltage potential when utilized as a high side device as will be discussed shortly. This metalization is comprised of varying constituents as is necessary to contact the region 16. This metalization is utilized to provide ultra low surface resistance to the guardring region 16 to collect the minority carriers.

Figure 15:
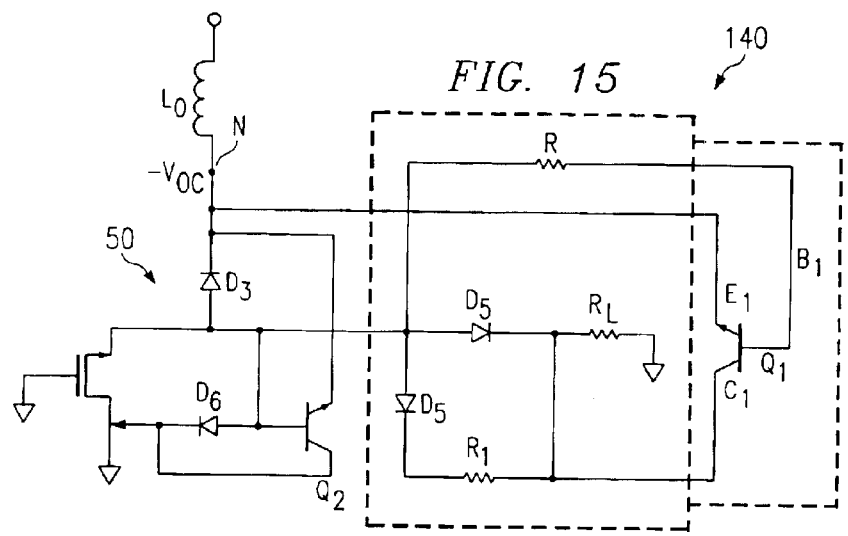
FIG. 15 is a schematic of the equivalent distributed model depicting the mechanism for collecting minority carriers that accumulate in the base region and heavily doped p-region when the diode D3 conducts for a negative condition at node N.

Referring now to FIG. 15, there is depicted at 140 a schematic of the equivalent distributed model whereby transistor Q1 represents the distributed transistor model that acts as the mechanism for collecting minority carriers that accumulate in the base region 34, 56 of the preferred embodiment when diode D3 conducts for a negative condition on node N being–Voc.

Diode D5 is the distributed collector $C_1$ diode. Resistor $R_1$ is the distributed resistance of layer 14, and resistor $R_L$ is the distributed resistance of the deep n-type region 16. The base region consists of distributed resistance R made up of the volume of region 34 and region 56.

In this system, another transistor exists in the form of transistor Q2, however, since diode D6 forming the base and collector is double as the body contact and source are shorted directly by metal so there is little field across the diode to enable carrier conduction, and the diode main current is flowing in this main terminal that is common.

Figure 16:
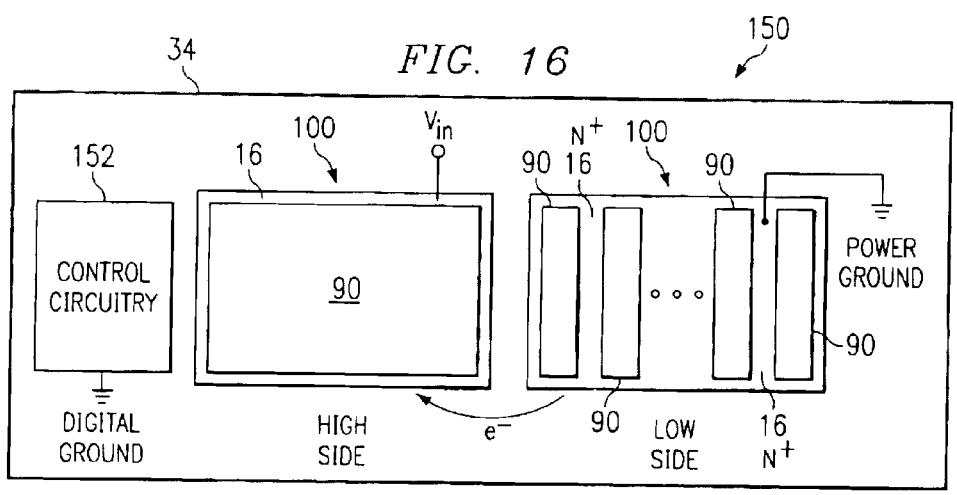
FIG. 16 depicts a semiconductor architecture layout with the high side power FET isolating the low side power FET from the control circuitry, and utilizing the minority collection arrangement to prevent the low side power FET from distributing the operation of the control circuitry.

Referring now to FIG. 16, there is shown generally at 150 a semiconductor architecture layout of the high side power FET and the low side power FET with relation to the control circuitry generally shown at 152. As shown in FIG. 16, the high side power FET is interposed between the control circuitry 152 and the low side power FET. Advantageously, any minority carriers that are not collected via the deep n-type region 16 to ground and which may travel towards the high side power FET are collected by the deep N+region 16 thereof. Advantageously, these minority carriers are sufficiently isolated from the control circuitry 152 such that they can not interfere with the operation of the control circuitry 152. The minority carriers will be collected to power ground at the low side power FET, but if any make it towards the high side power FET, are collected by the deep N+ region 16 tied to a positive potential $V_{in}$. Connecting the deep N+ region 16 to a positive potential increases the depth of the depletion region below the deep N+ region and the NBL under the high-side FET, increasing this region's efficiency at collecting the stray minority carriers at the expense of a negligible power loss. Due to the substantial size of the high side FET comparable in size to the low side FET), any stray minority carriers passing the high side FET have a high probability of being collected, since their time in proximity to the High side FET is much larger than would be the case for a normal guardring which would be much thinner. Use of the high-side FET in this manner affords a very effective minority carrier collector without consuming additional area which would otherwise be required. The architecture of this power circuit system on a substrate, in combination with the minority carrier reduction and collection of the present invention, is floor planned to minimize the worst case parasitic action that may interact with the control circuitry 152 of the integrated circuit 150. The present invention provides a method of protecting the integrated circuit from minority carrier damage while still fitting specific package form factors. The integrated circuit layout 150 is an in-line self protecting multiple output power integrated circuit architecture that compensates for the parasitic action of the power FETs during operation and during minority current collection.

Figure 17:
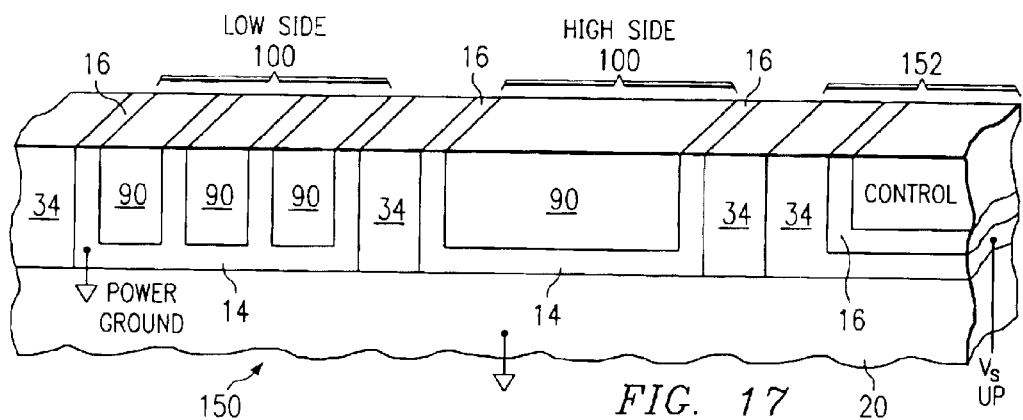
FIG. 17 depicts a cross section of the device of FIG. 16 illustrating the low side power FET being isolated from the control circuitry by the high side power FET.

FIG. 17 depicts a cross section of the device 150, illustrating the low side power FET being isolated from the control circuitry 152 by the high side power FET. Both a deep N+ region 16 and a P-epi tank 34 separate the high side power FET from the low side power FET. The power ground is separate from the control circuit ground, as shown, to avoid disturbing the operation of the control circuitry 152.

Figure 18:
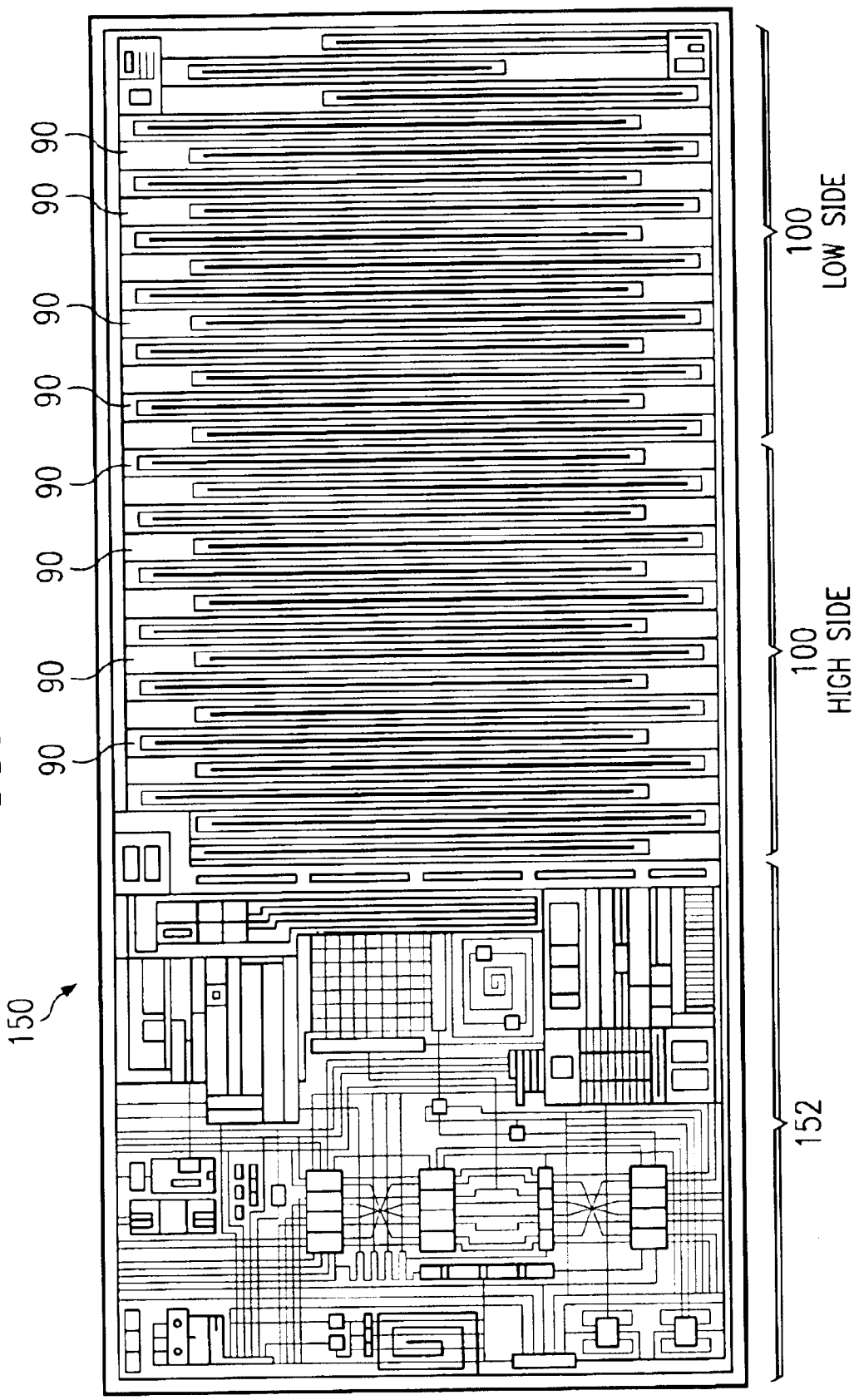
FIG. 18 is a top view picture of the layout of FIG. 16 depicting the rows of transistor arrays in both the high side FET and the low side FET, with the low side FET being divided by rows of N+ sinker to collect minority carriers and distribute the NBL resistance.

FIG. 18 is a top view picture of the semiconductor circuit layout 150 of FIG. 16 depicting the rows of transistor arrays 90 in both the high side FET and the low side FET, with the low side FET being divided by rows of N+ sinker 16 to collect minority carriers and distribute the NBL 14 resistance. Although the N+ sinker rows 16 occupy semiconductor real estate area, the significant advantage of the N+ sinker rows is the ability of the low side FET to switch a very high current without forward biasing the substrate parasitic diode D4 as discussed. Moreover, the N+ sinker rows 16 collect minority carriers to avoid destabilizing the control circuitry 152. The N+ sinker 16 encompassing the high side FET and being tied to a high potential further collects any stray minority carriers before they reach the control circuitry, as discussed. Moreover, the in-line layout of the circuit 150 has the additional advantage of being pin comparable when packaged in a semiconductor package.

Power Efficiency

Building the FETs as isolated structures in a DC/DC power converter, the present invention achieves technical advantages by containing the minority carriers in the FETs to reduce the quantity of minority carriers that have to be removed from the associated back-diode (body diode) when that diode is turning off. The process of turning off the diode disadvantageously results in current drawn from the positive power supply (Vsup) to remove the "reverse recovery charge" Qrr. This is a power loss, and the energy consumed each cycle is Qrr*Vsup.

For purposes of comparison, measurements of a non-isolated DMOS device versus the isolated device 150 in the present invention found the following:

Non-Isolated DMOS Device:
    Reverse recovery charge (Qrr)=440 nC at a load current load=10A Vsup=5V Energy lost per cycle, E=Qrr*Vsup=2.2 uJ Frequency of operation, f=700 kHz Power loss, Prr=E*f=2.2E−6*700E3=1.54W Typical output voltage of converter, Vout=1.8V Power output, Pout=load*Vout=18W Efficiency loss through reverse recovery=Prr/Pout=1.54/18=8.6%

Isolated FET of Present Invention:

Qrr at 10A=30 nC at load current load=10A

With all other conditions the same as above,

Efficiency loss through reverse recovery=0.6%

To put this in perspective, the present invention 150 achieves an overall power efficiency in excess of 96%. Without using the isolated device 150, efficiency is less than 90%. More significantly, the package used to package the IC 150 has absolute limits on the power that can be dissipated. It is this power dissipation that limits the maximum output current the present invention can run at. Having the non-isolated power device would increase power dissipation by approximately 3×, reducing the maximum current we could operate at by about 2×. Alternatively, we could radically reduce switching frequency, f, but this is not desirable as it increases the board area occupied by the external components in the total system.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A power integrated circuit, comprising:

a substrate;

a buried layer formed on the substrate;

a control circuit disposed over said buried layer;

a low side transistor disposed over said buried layer; and a high side transistor disposed over said buried layer and interconnected to said low side transistor, said high side transistor being interposed between said control circuit and said low side transistor.

2. The circuit as specified in claim 1 wherein said low side transistor and said high side transistor are separated from one another by a deep n-type region.

3. The circuit as specified in claim 2 wherein said low side transistor and said high side transistor are also separated from one another by a P-epi tank.

4. The circuit as specified in claim 1 wherein said low side transistor is comprised of multiple transistor arrays partitioned by at least one deep n-type region, whereby said deep n-type region forms a guardring about a respective said transistor array.

5. The circuit as specified in claim 4 wherein each guardring isolates minority carriers in one transistor array from another said transistor array.

6. The circuit as specified in claim 5 wherein said guardring sinks minority carriers away from said low side transistor.

7. The circuit as specified in claim 6 wherein said guardring is tied to ground.

8. The circuit as specified in claim 4 wherein said guardring sinks minority carriers away from said control circuit.

9. The circuit as specified in claim 4 wherein said high side transistor is comprised of multiple transistor arrays partitioned by at least one deep n-type region forming a guardring about a respective said high side transistor array.

10. The circuit as specified in claim 9 wherein said high side transistor guardring is tied to a voltage potential, while said low side transistor guardring is tied to ground.

11. The circuit as specified in claim 4 wherein said low side transistor guardring is tied to a ground being different than a ground of said logic circuit.

12. The circuit as specified in claim 11 wherein the substrate is tied to ground.

13. The circuit as specified in claim 11 wherein said low side transistor has a gate, source and drain formed in a p-type layer, a first p-doped region disposed proximate the source, and a second p-doped region disposed proximate the drain adapted to collect minority carriers.

14. The circuit as specified in claim 13 wherein said first p-doped region is more heavily doped than said second p-doped region.

15. The circuit as specified in claim 14 wherein said second p-doped region is more heavily doped than said p-type layer.

16. The circuit as specified in claim 13 wherein said p-type layer is a P-epi tank.

17. The circuit as specified in claim 16 wherein said buried layer is an NBL layer.

18. The circuit as specified in claim 17 wherein said high side transistor is separated from said low side transistor by a N+ well.

19. The circuit as specified in claim 13 wherein said low side transistor is comprised of a plurality of transistors connected in parallel and partitioned by at least one deep n-type region.

20. The circuit as specified in claim 19 wherein the deep n-type region is grounded.

* * * * *